United States Patent
Sharma et al.

[11] Patent Number: 6,017,792
[45] Date of Patent: Jan. 25, 2000

[54] PROCESS FOR FABRICATING A SEMICONDUCTOR DEVICE INCLUDING A NONVOLATILE MEMORY CELL

[75] Inventors: Umesh Sharma; Shih-Wei Sun; John R. Yeargain, all of Austin, Tex.

[73] Assignee: Motorola, Inc., Schaumburg, Ill.

[21] Appl. No.: 08/650,581

[22] Filed: May 22, 1996

Related U.S. Application Data

[62] Division of application No. 08/300,893, Sep. 6, 1994, abandoned.

[51] Int. Cl.[7] .................................................. H01L 21/336
[52] U.S. Cl. .......................... 438/257; 438/593; 438/594; 257/316; 257/318; 257/321
[58] Field of Search .................................. 257/318, 316, 257/321; 438/257, 593, 594

[56] References Cited

U.S. PATENT DOCUMENTS

| | | | |
|---|---|---|---|
| 4,627,027 | 12/1986 | Rai et al. | 365/45 |
| 5,089,433 | 2/1992 | Anand et al. | 257/318 |
| 5,453,634 | 9/1995 | Mori | 257/316 |
| 5,457,335 | 10/1995 | Kuroda et al. | 257/318 |

FOREIGN PATENT DOCUMENTS

| | | | |
|---|---|---|---|
| 4-273168 | 9/1992 | Japan | 257/316 |
| 5-275712 | 10/1993 | Japan | |

OTHER PUBLICATIONS

Yoshikawa et al.; "An EPROM Cell Struction for EPLD's Compatible with Single Poly–Si Gate Process;" IEEE Trans. on Electron Devices; vol. 37, No. 3; pp. 675–679 (1990).

Wolf et al.; Silicon Processing for the VLSI Era; vol. 1: *Process Technology*; Lattice Press; p. 385 (1986).

Krakauer et al.; "ESD Protection in a 3.3 V Sub–Micron Silicided CMOS Technology;" EOS/ESD Symposium Proceedings—1992; pp. 250–257 (1992).

*Primary Examiner*—Jey Tsai
*Assistant Examiner*—David A. Zarneke

[57] ABSTRACT

A nonvolatile memory device includes a floating-gate electrode (14) overlying a surface (24) of a substrate (10). A diffusion barrier layer (34) extends from the substrate surface (24) along a wall surface (30) of the floating-gate electrode (14) to an upper surface (32) of the floating-gate electrode (14) and overlies the upper surface (32). The diffusion barrier layer (34) blocks the silicidation of the floating-gate electrode (14) and prevents ionic contaminants from diffusing to the floating-gate electrode (14). A charge control region (42) of the floating-gate electrode (14) is capacitively coupled to a well region (40) within the substrate (10). The well region (40) functions as a diffused control-gate electrode and regulates the voltage of the floating-gate electrode (14).

6 Claims, 3 Drawing Sheets

PROCESS FOR FABRICATING A SEMICONDUCTOR DEVICE INCLUDING A NONVOLATILE MEMORY CELL

This is a divisional of application Ser. No. 08/300,893, filed Sep. 6, 1994 and now abandoned.

FIELD OF THE INVENTION

This invention relates, in general, to semiconductor devices and their fabrication, and more particularly, to a nonvolatile semiconductor device having improved data retention characteristics, and to a method of fabrication.

BACKGROUND OF THE INVENTION

State of the art nonvolatile memory devices are typically constructed by fabricating a field effect transistor (FET) in a silicon substrate. The field effect transistor is capable of storing electrical charge in the gate electrode of the transistor. The gate electrode is known as a floating-gate electrode and is separated from the silicon substrate by a dielectric layer. Data is stored in a nonvolatile memory device by changing the threshold voltage of the field effect transistor. The threshold voltage of the FET is shifted to a higher or lower value through the storage of electrical charge in the floating-gate electrode of the field effect transistor. For example, in an N-channel transistor, an accumulation of electrons in a floating-gate electrode creates a high threshold voltage. Conversely, the removal of electrons from the floating-gate electrode creates a low threshold voltage.

The nonvolatile memory device is "read" by applying a voltage to the drain terminal and the control gate electrode, while keeping the substrate at ground potential. A sense amplifier is connected to the source terminal to measure any current flowing through the device. The read voltages are chosen such that no current flows through the device if it is programmed to the high voltage level. However, a measurable current flows if the device has a low threshold voltage level.

The logic state of the nonvolatile memory device is determined by presence or absence of a measurable current when read voltages are applied. Conventionally, the detection of current flow through the FET is defined as a logic "0" state. Conversely, the absence of current flow in the FET is defined as a logic "1" state.

In the operation of a nonvolatile memory device, it is important that the charge placed on the floating-gate electrode remain at a constant value until the memory device is deliberately reprogrammed. The ability of a nonvolatile memory device to maintain charge on the floating-gate electrode is characterized as the data retention capability of the memory device. Ideally, a nonvolatile memory device should have infinite data retention capability. However, many nonvolatile devices exhibit less than optimal data retention because of unwanted charge dissipation from the floating-gate electrode. Typically, negative charge on the floating-gate electrode can be dissipated through diffusion of ionic contaminates through the overlying passivation layers and into the floating-gate electrode. For example, sodium ions impinging on the floating-gate electrode result in data loss by shifting the logic state of the nonvolatile memory device from a logical "1" to a logical "0".

Poor data retention can also arise in a nonvolatile memory device by the generation of a nonuniform electric field near the floating-gate electrode. A nonuniform electric field can result from sharp corners and protrusions of the floating-gate electrode. The concentration of electric field lines at the corners of the floating-gate electrode is exacerbated when the floating-gate electrode is fabricated from a material having a metallic content, such as a silicide material or a pure metal. Nonvolatile fabrication process which use refracting metal silicides to increase the electrical conductivity of the device can have severely nonuniform electrical fields around the floating-gate electrode. High field concentration can disrupt the electrical charge on the floating-gate electrode and shift the threshold voltage of the FET. Accordingly, further development of nonvolatile memory device and design fabrication processes are necessary to provide nonvolatile memory devices having improved data retention.

SUMMARY OF THE INVENTION

In practicing the present invention there is provided a nonvolatile memory device having an encapsulated floating-gate electrode, and a process for fabricating the device. In one embodiment of the invention, a diffused control-gate region, resides in a substrate. A well region also resides in the substrate and is electrically isolated from the control-gate region. A floating-gate electrode overlies the well region and the control-gate region and is separated therefrom, by the dielectric layer. The floating-gate electrode is characterized by a wall surface extending from the dielectric layer to an upper surface thereof. The floating-gate electrode is capacitively coupled to the control-gate region. A diffusion barrier overlies the floating-gate electrode and is in intimate contact with the wall surface and the upper surface.

A process for fabricating the nonvolatile semiconductor device of the invention includes providing a substrate having a first surface region of a first conductivity type adjacent to a second surface region of a second conductivity type. An isolation region is formed intermediate to the first and second surface regions and a gate oxide layer is formed overlying the first and second surface regions. A floating-gate electrode is formed to overlie the first and second surface regions and the isolation region. Then a diffusion barrier layer is conformally deposited and anisotropically etched.

Figure 1:
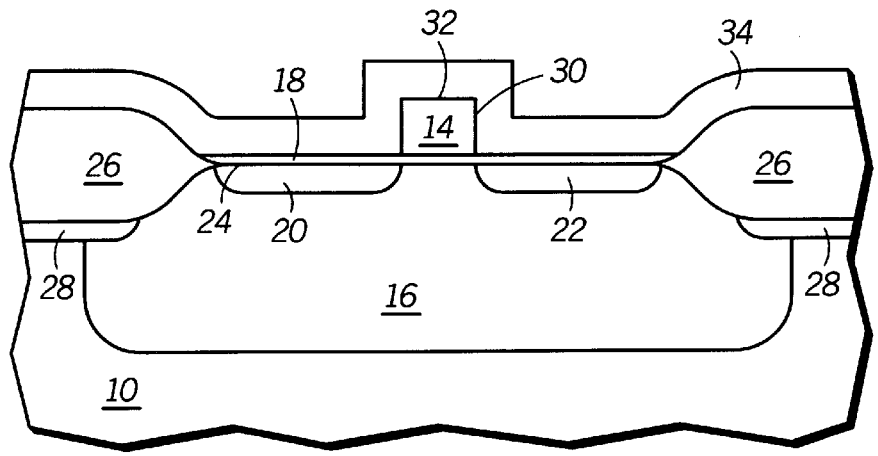
FIGS. 1–3 illustrate, and cross-section, process steps for the fabrication of a nonvolatile memory device in accordance with one embodiment of the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

The present invention provides a nonvolatile memory device having improved immunity to data retention errors caused by electrically charged contaminates contacting the floating gate electrode. Additionally, improved data retention is realized through minimizing variations of the electric field intensity within a silicided nonvolatile device. To improve device performance, a diffusion barrier layer encapsulates the floating-gate electrode blocking the silicidation of the floating-gate electrode and preventing ionic contaminants from diffusing to the floating-gate electrode. Furthermore, the nonvolatile memory device of the invention can be fully integrated in a device fabrication process for the manufacturer of various types of semiconductor devices, such as microcontroller devices, microprocessor devices, and logic devices, and the like.

FIGS. 1–4, illustrate, in cross-section, process steps in accordance with one embodiment of the invention. Shown in FIG. 1 is a portion of a semiconductor substrate 10 including a field effect transistor 12 fabricated in accordance with the invention. Field effect transistor 12 includes a floating-gate electrode 14 overlying a P-well region 16 and separated therefrom by a gate dielectric layer 18. Source and drain regions 20 and 22, respectively, reside in P-well region 16 on either side of floating gate electrode 14. Source and drain regions 20 and 22 are formed at a substrate surface 24, which is bounded by a field isolation region 26. For clarity of illustration, dielectric layer 18 is shown as a single layer overlying substrate surface 24. However, those skilled in the art will appreciate that a multi-layer dielectric material can be used including silicon dioxide formed by various methods, such as chemical vapor deposition, and thermal oxidation, and the like.

Preferably, floating-gate electrode 14 is formed by the chemical vapor deposition of polycrystalline silicon followed by anisotropic etching to define a floating-gate electrode pattern on substrate 10. Source and drain regions 20 and 22 are preferably formed by an ion implantation process using floating-gate electrode 14 as an implant mask to self-aligned the source and drain regions to the edges of floating-gate electrode 14. The anisotropic etching process used to form floating-gate 14 forms a vertical wall surface 30, which extends from gate dielectric layer 18 to an upper surface 32. The ion implantation process aligns source and drain region 20 and 22 to wall surface 30 of floating-gate electrode 14. Source and drain regions 20 and 22 are heavily doped with an N-type dopant by the ion implantation process. The ion implant process is also used to simultaneously form resistors in other portions of substrate 10 (not shown).

In operation, the nonvolatile device is programmed by injecting electrons across gate dielectric layer 18 and into floating gate electrode 14. The electrical charge injected into floating-gate electrode 14 raises the threshold voltage of field effect transistor 12. Field effect transistor 12 is electrically isolated from regions of substrate 10 surrounding P-well region 16 by field isolation region 26, and by a channel stop region 28 underlying field isolation region 26.

In accordance with the invention, processing steps are carried out to form a diffusion barrier layer that encapsulates floating-gate electrode 14. The diffusion barrier fabrication process begins by depositing a diffusion barrier layer 34 to overlie floating-gate electrode 14, gate dielectric layer 18, and field isolation region 26. Preferably, the diffusion barrier 34 is silicon nitride deposited by a chemical vapor deposition process.

Figure 2:
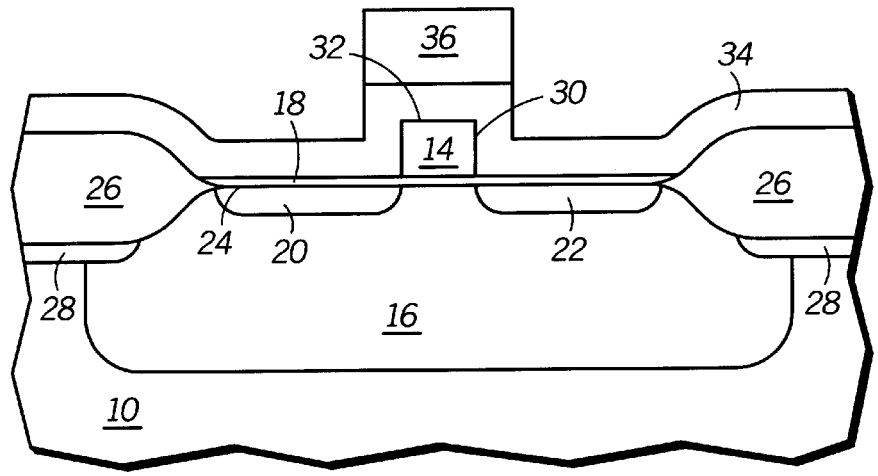

The fabrication process continues with the formation of an etching mask 36 on diffusion barrier layer 34, as illustrated in FIG. 2. Etching mask 36 is generally aligned to a portion of diffusion barrier layer 34 overlying floating-gate electrode 14. Etching mask 36 can be formed from any material which is differentially etchable with respect to diffusion barrier layer 34. In one embodiment of the invention, etching mask 36 is a photoresist layer.

Figure 3:
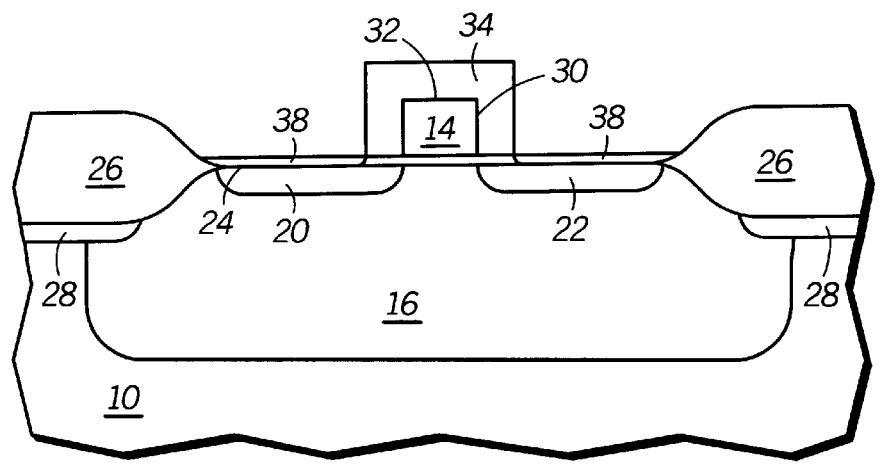

Following the formation of etching mask 36, an etching process is carried out to encapsulate floating-gate electrode 14 in diffusion barrier layer 34, as illustrated in FIG. 3. Once the etching process is complete, etching mask 36 is removed leaving diffusion barrier layer 34 overlying wall surface 30 and upper surface 32 of floating-gate electrode 14. After encapsulating floating-gate electrode 14, silicide regions 38 are formed in source and drain regions 20 and 22 at substrate surface 24.

Preferably, silicide regions 38 are formed by the blanket deposition of a refractory metal layer to overlie substrate 10, followed by an annealing process to react the refractory metal with silicon at substrate surface 24. The chemical reaction induced by the annealing process forms a refractory metal silicide at the interface of the refractory metal layer and substrate surface 24. In a preferred embodiment, the refractory metal is titanium and the refractory metal silicide is titanium silicide. It is important to note that the silicidation process does not form a silicide layer on any portion of floating-gate electrode 14. By avoiding the formation of silicide regions on floating-gate electrode 14, high electric field concentration at the corners of floating-gate electrode 14 is minimized.

An important aspect of the present invention is the compatibility of the fabrication process for the encapsulation of the a floating-gate electrode with existing metal-oxide-semiconductor (MOS) fabrication processes. For example, the diffusion barrier layer can also be used to form sidewall spacers on MOS gate electrodes (not shown). Specifically, the anisotropic etching process, which encapsulates the floating gate-electrodes, also forms sidewall spacers used in the fabrication of lightly-doped drain (LDD) regions in the MOS transistors. Furthermore, the silicidation process forms a silicide layer on the surface of the MOS gate electrodes. However, since the diffusion barrier layer blocks the silicidation of the floating-gate electrodes, only the source and drain regions in the nonvolatile memory cells contain a silicide region. The ability to fully fabricate the nonvolatile memory device of the invention in a conventional MOS process, without additional processing steps, advantageously provides additional memory capacity without increasing the production cost of the integrated circuit.

Figure 4:
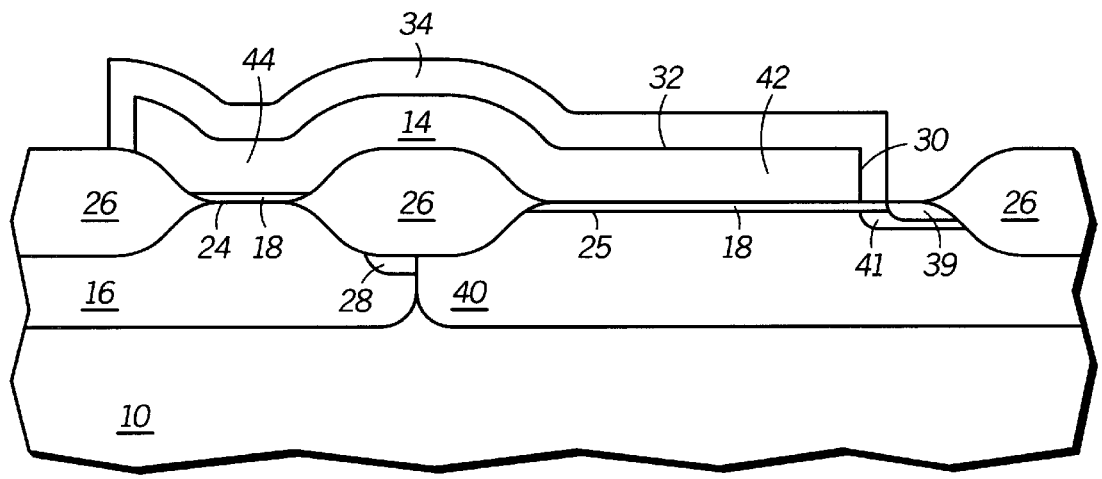
FIG. 4 illustrates, and cross-section, a lateral view of the encapsulated floating-gate electrode of the invention.

A lateral view of the nonvolatile memory device of the invention is illustrated in FIG. 4. Floating-gate electrode 14 extends over field isolation region 26 and overlies well region 40. Well region 40 is electrically isolated from P-well region 16 by field isolation region 26, and by channel stop region 28. Floating-gate electrode 14 is separated from well region 40 by gate dielectric layer 18. A portion of silicide region 39 overlies well region 18 and extends between field isolation region 26 and diffusion barrier layer 34. A lightly doped drain (LDD) region 41 resides in well region 40 beneath silicide region 39. LDD region 41 is formed by ion implantation at the time that other MOS transistors (not shown) are fabricated in substrate 10.

Floating-gate electrode 14 is capacitively coupled to well region 40, such that well region 40 functions as a diffused control gate region. In operation, a voltage applied to well region 40 will be coupled to floating-gate 14 through dielectric layer 18 overlying well region 40. Under programming conditions, the voltage applied to floating-gate electrode 14 from well region 40 at substrate surface 25, together with programming and erasing voltages applied to source and drain regions 20 and 22, causes electrons be injected into the portion of floating-gate electrode 14 overlying substrate surface 24. Accordingly, the functional aspects of the non-volatile semiconductor device of the invention effectively partition floating-gate electrode 14 into a charge control region 42 and a charge injection region 44.

Figure 5:
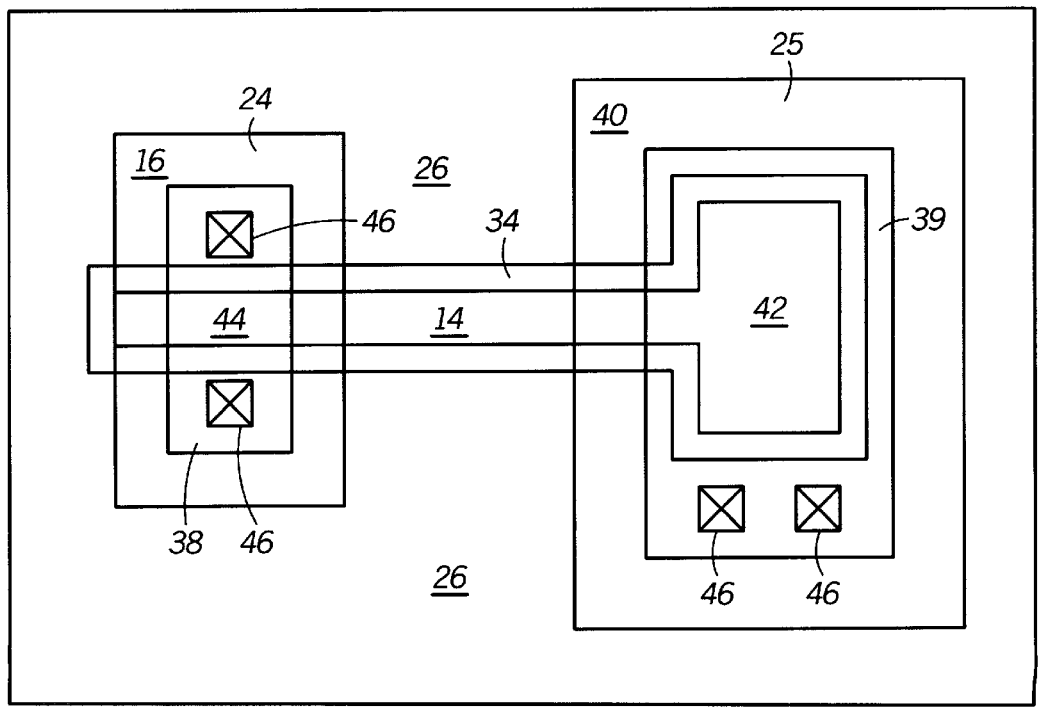
FIG. 5, illustrates in plan view the nonvolatile memory device of the invention.

The geometric characteristics of floating-gate electrode 14 are more clearly illustrated in the plan view shown in FIG. 5. Field isolation region 26 surrounds surface regions 24 and 25 of well regions 16 and 40, respectively. Silicide region 38 resides on either side of charge injection region 44, and silicide region 39 surrounds charge control region 42. Electrical contacts 46 provide access to source and drain regions 20 and 22, and to well region 40.

The geometric configuration of floating-gate electrode 14 illustrated in FIGS. 4 and 5, is characterized by numerous edges and sharp corners. In nonvolatile memory devices, silicidation processes used to form silicide regions in the substrate surface can also form a silicide layer at the surface of gate electrodes overlying the substrate. Any sharp corner of a conductive body provides a site where electric field lines can converge. Furthermore, the enhanced electrical conductivity of a metal silicide increases the convergence of electric field lines. Points of high electric field intensity can change the electrical potential of the floating-gate electrode and cause data retention errors. Diffusion barrier layer 34 blocks the silicidation of floating-gate electrode 14, which minimizes the electric field density at the corners of floating-gate electrode 14.

Additionally, the diffusion barrier layer 34 prevents ionic contaminates, such as sodium and potassium ions, from diffusing into floating-gate electrode 14. Ionic contaminates impinging on the floating-gate can alter the electrical charge of the floating-gate electrode and change the logic state of the memory cell. Thus, diffusion barrier layer 34 minimizes data retention errors by preventing ionic contaminants such as sodium and potassium, and the like, from contacting floating-gate electrode 14.

In one embodiment of the invention, the fabrication process illustrated in FIGS. 1–3 can be used to fabricate a one-time programmable (OTP) nonvolatile memory device. The portion of diffusion barrier layer 34 overlying upper surface 32 of floating-gate electrode 14 is of a thickness sufficient to prevent ultraviolet radiation from altering the electrical charge of floating-gate 14. For the formation of an OTP device, diffusion layer barrier 34 is formed by chemical vapor deposition of silicon nitride to a thickness to about 1000 to 2000 angstroms.

Figure 6:
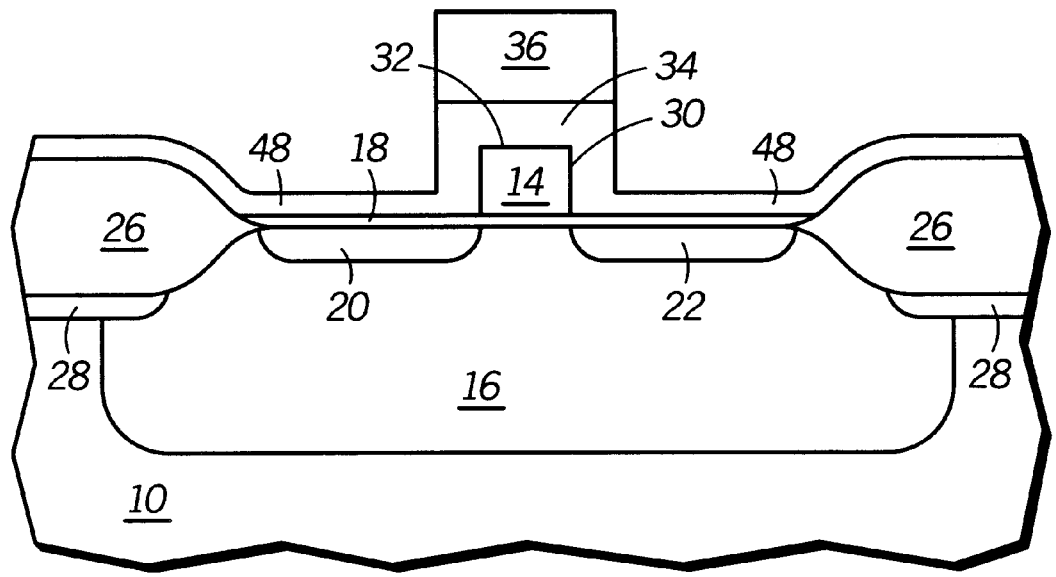
FIGS. 6–7 illustrate, cross-section, the nonvolatile memory device of the invention in accordance with an alternative embodiment.
Figure 7:
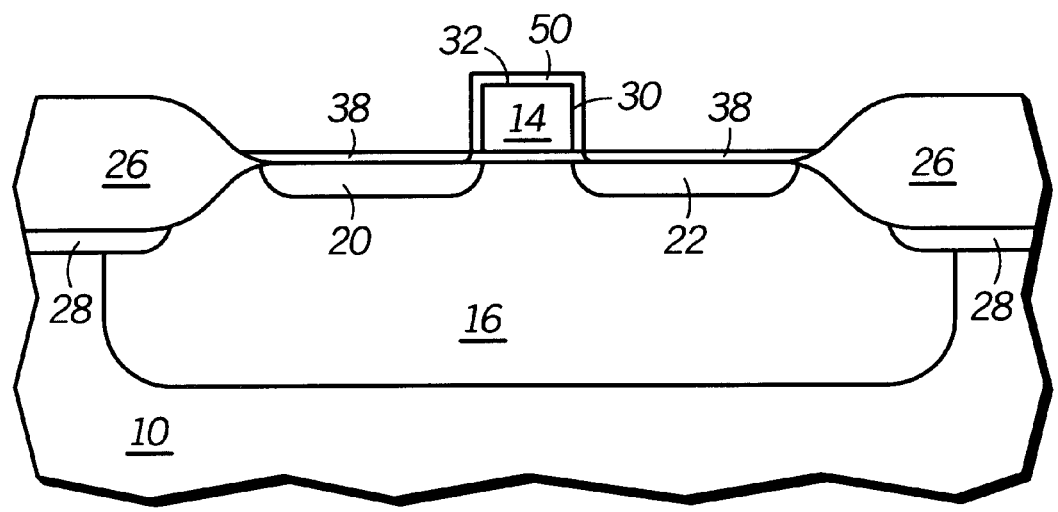

An alternative embodiment of the invention is illustrated in FIGS. 6–7, for the formation of an electrically-erasable-read-only-memory (EPROM) device. In the alternative embodiment, etching mask 36 is formed on diffusion barrier layer 34 in the same manner as previously described. Then, an etching process is carried out to anisotropically etch diffusion barrier layer 34, leaving thin lateral extensions 48 overlying portions of substrate 10 not protected by etching mask 36. The etching process leaves a thick portion of diffusion barrier layer 34 in contact with wall surface 30 and upper surface 32 of control-gate electrode 14.

Once extension regions 48 are formed, etching mask 36 is removed and the anisotropic etching process is continued to form an ultraviolet transparent layer 50 encapsulating floating-gate electrode 14. During the subsequent etching process, extension regions 48 are completely etched away from the surface of substrate 10. Thus, the sequential etching process results in the formation of a diffusion barrier layer encapsulating floating-gate electrode 14. The diffusion barrier layer has a minimal thickness, such that ultraviolet radiation can penetrate the diffusion barrier layer and alter the charge state of floating-gate 14. By providing a diffusion barrier which is transparent to ultraviolet radiation, the nonvolatile memory device of the alternative embodiment can be erased and reprogrammed. In the case of an EPROM device, ultraviolet transparent layer 50 has a thickness of about 200 to 500 angstroms.

Thus it is apparent that there has been provided, in accordance with the invention, a nonvolatile memory device having an encapsulated floating-gate electrode which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, multi-chambered deposition and etching equipment can be used to deposit composite dielectric layers, and to prepare exposed surfaces of the substrate for thin-film deposition. Further, additional substrate doping steps can be carried out to form drain extensions, and graded junctions, and the like. It is therefore intended to include within the invention all such variations and modifications as fall within the scope of the appended claims and equivalents thereof.

We claim:

1. A process for fabricating a semiconductor device including a nonvolatile memory cell comprising the steps of:
    providing a substrate having a first surface region of a first conductivity type adjacent to a second surface region of a second conductivity type;
    forming an isolation region intermediate to the first and second surface regions;
    forming a gate dielectric layer overlying the first and second surface regions;
    forming a floating-gate electrode overlying the gate dielectric layer, the first and second surface regions and the isolation region, wherein:
        the floating-gate electrode includes a first portion and a second portion;
        the first portion overlies the first surface region; and
        the second portion overlies and is capacitively coupled to the second surface region;
    forming a source region, a drain region, and a contact region, wherein:
        the source and drain regions lie within the first surface region; and
        the contact region lies within the second surface region;
    forming a diffusion barrier layer encapsulating the floating-gate electrode and leaving exposed portions of the source, drain, and contact regions; and
    forming silicide regions over the exposed portions of the source, drain, and contact regions while the diffusion barrier layer encapsulates the floating-gate electrode,
    wherein the second surface region is at least part of a control-gate electrode for the nonvolatile memory cell, and wherein the nonvolatile memory cell further includes the floating-gate electrode, the source region, and the drain region.

2. The process of claim 1, wherein the step of forming a diffusion barrier layer comprises the steps of:
    depositing a silicon nitride layer to overlie the floating-gate electrode;

forming an etching mask on the silicon nitride layer; and etching the silicon nitride layer.

3. The process of claim 2, wherein the step of etching the silicon nitride layer comprises the steps of:

partially etching the silicon nitride layer;

removing the etching mask; and continuing to etch the silicon nitride layer to expose the first and second surface regions.

4. A process for fabricating a semiconductor device including a nonvolatile memory cell comprising the steps of:

providing a substrate having a first surface region, a second surface region, and a third surface region, wherein the first surface region of a first conductivity type is adjacent to a second surface region of a second conductivity type;

forming an isolation region intermediate to the first and second surface regions;

forming a gate dielectric layer overlying the first and second surface regions;

forming a floating-gate electrode and an MOS gate electrode, wherein:
  the floating-gate electrode overlies the gate dielectric layer, the first and second surface regions and the isolation region;
  the MOS gate electrode overlies the third surface region;
  the floating-gate electrode includes a first portion and a second portion;
  the first portion overlies the first surface region; and
  the second portion overlies and is capacitively coupled to the second surface region;

forming a source region, a drain region, and a contact region, wherein:
  the source and drain regions lie within the first surface region; and
  the contact region lies within the second surface region;

forming a diffusion barrier layer encapsulating the floating-gate electrode;

anisotropically etching the diffusion barrier layer to form sidewall spacers adjacent to the MOS gate electrode; and forming silicide regions over the source, drain, and contact regions and the MOS gate electrode while the diffusion barrier layer encapsulates the floating-gate electrode, wherein the second surface region is at least part of a control-gate electrode for the nonvolatile memory cell, and wherein the nonvolatile memory cell further includes the floating-gate electrode, the source region, and the drain region.

5. The process of claim 4, wherein the step of forming a diffusion barrier layer comprises the steps of:

depositing a silicon nitride layer to overlie the floating-gate electrode;

forming an etching mask on the silicon nitride layer; and etching the silicon nitride layer.

6. The process of claim 5, wherein the step of etching the silicon nitride layer comprises the steps of:

partially etching the silicon nitride layer;

removing the etching mask; and continuing to etch the silicon nitride layer to expose the first and second surface regions.

* * * * *